(12) United States Patent
Gueler

(10) Patent No.: US 7,344,352 B2
(45) Date of Patent: Mar. 18, 2008

(54) WORKPIECE TRANSFER DEVICE

(75) Inventor: Richard Gueler, Santa Rosa, CA (US)

(73) Assignee: Axcelis Technologies, Inc., Beverly, MA (US)

( * ) Notice: Subject to any disclaimer, the term of this patent is extended or adjusted under 35 U.S.C. 154(b) by 144 days.

(21) Appl. No.: 11/219,281

(22) Filed: Sep. 2, 2005

(65) Prior Publication Data
US 2007/0065267 A1    Mar. 22, 2007

(51) Int. Cl.
*B66C 1/00* (2006.01)
(52) U.S. Cl. ............ 414/740; 294/87.1; 294/99.1; 294/118
(58) Field of Classification Search ......... 414/749.1, 414/680, 739, 740; 901/31, 36, 37, 38, 39; 294/118, 87.1, 99.1, 99.2
See application file for complete search history.

(56) References Cited

U.S. PATENT DOCUMENTS

| | | | |
|---|---|---|---|
| 4,020,846 A * | 5/1977 | Stokes | 606/131 |
| 5,172,951 A | 12/1992 | Jacobsen et al. | |
| 5,229,615 A | 7/1993 | Brune et al. | |
| 6,190,103 B1 | 2/2001 | Erez et al. | |
| 6,513,848 B1 | 2/2003 | Shendon et al. | |
| 6,578,893 B2 * | 6/2003 | Soucy et al. | 294/99.1 |
| 6,918,735 B2 | 7/2005 | Urban et al. | |
| 2001/0036394 A1 * | 11/2001 | Tanaka et al. | 414/225.01 |

FOREIGN PATENT DOCUMENTS

JP        08 090477 A        4/1996

OTHER PUBLICATIONS

International Search Report for PCT International No. PCT/US06/034323 dated Mar. 08, 2007.

* cited by examiner

*Primary Examiner*—Donald Underwood
(74) *Attorney, Agent, or Firm*—Tarolli, Sundheim, Covell & Tummino LLP

(57) ABSTRACT

A workpiece transfer assembly for manipulating one or more workpieces, such as semiconductor wafers includes a plurality of coacting arms that include one or more arcuate portions corresponding to an outer diameter of a workpiece. The arcuate portion has a workpiece engaging surface adapted to engage an outer edge of the workpiece. At least one of the coacting arms includes a flexure assembly that allows deformation of the workpiece engaging surface in a direction away from the workpiece in response to pressure on the outer edge of the workpiece from the workpiece engaging surface.

7 Claims, 4 Drawing Sheets

WORKPIECE TRANSFER DEVICE

TECHNICAL FIELD

The present invention relates generally to ion implantation equipment and more particularly to an improved end station for an ion implantation.

BACKGROUND

The processing of semiconductor wafers involves many processing steps including implantation, thermal processing, and selective exposure to various chemical agents. As wafers proceed through an implantation facility they are transferred between specialized processing chambers and stations. Robots are routinely used to transfer wafers. The robots have specialized end effectors adapted to securely grip semiconductor wafers. During processing semiconductor wafers are susceptible to defects caused by non-uniform or excessive forces, particularly around the edges of the wafer, and damage done by end effectors can adversely affect the yield of semiconductor wafers.

SUMMARY

Including a flexure as part of a workpiece transfer arm regulates the amount of pressure that is placed on the workpiece edge and reduces the likelihood of pressure induced defects such as particle generation.

A workpiece transfer assembly for manipulating one or more workpieces, such as semiconductor wafers, includes a plurality of coacting arms that include one or more workpiece engaging portions corresponding to an outer contour of a workpiece. The workpiece engaging portion has a workpiece engaging surface adapted to engage an edge of the outer contour of the workpiece. At least one of the coacting arms includes a flexure assembly that allows deformation of the workpiece engaging surface in a direction away from the workpiece edge in response to pressure on the outer edge of the workpiece from the workpiece engaging surface.

The workpiece transfer assembly may advantageously include a pair of coacting arms including a fixed arm and a moving arm that rotates about a pivot point to engage the outer edge of the workpiece. In this instance, each of the coacting arms includes an arcuate portion at each of two distal ends. Each coacting arm is connected to the pivot point. Either arm may include a flexure assembly that forms a part of the arm outside of the workpiece engaging surface such as a notch cut into the arm between a pivot portion of the arm and a workpiece engaging portion of the arm. The flexure assembly may also be a flexible finger that forms the workpiece engaging surface.

DESCRIPTION

Figures 1, 1A:
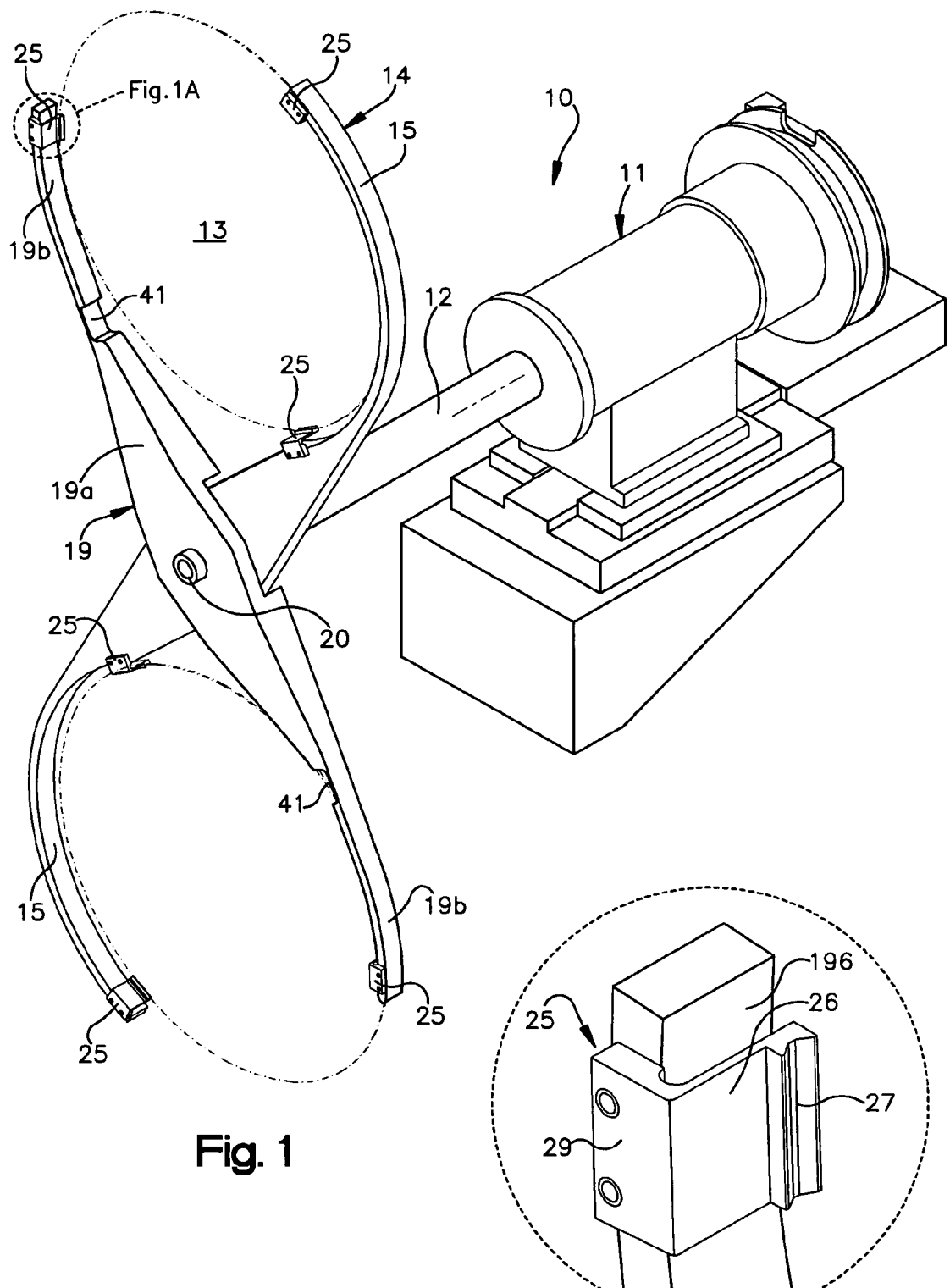
FIG. 1 is a front perspective view of a workpiece transfer assembly that features a transfer arm assembly constructed in accordance with one embodiment of the present invention.
FIG. 1A is a close up fragmentary view of the workpiece transfer assembly of FIG. 1.

FIG. 1 illustrates a workpiece handling robot 10 adapted for use with semiconductor wafers. The robot includes a robot body 11 from which a rotatable shaft 12 protrudes. At a distal end of the shaft 12 a transfer arm assembly, designated generally at reference character 14, is mounted for transferring workpieces between processing and storage stations. The transfer arm assembly 14 includes a pair of workpiece support arms. A fixed arm 15 is fixed to the rotating shaft 12 and does not move relative to the shaft. A moving arm 19 is capable of relative motion with respect to the rotating shaft 12. The relative motion of the moving arm is limited as shown in FIG. 2 to a short excursion "L" as the moving arm is rotated about a pivot mounting point 20 between a retention position shown in FIG. 1 and a release position shown in FIGS. 5A and 5D.

Figure 2:
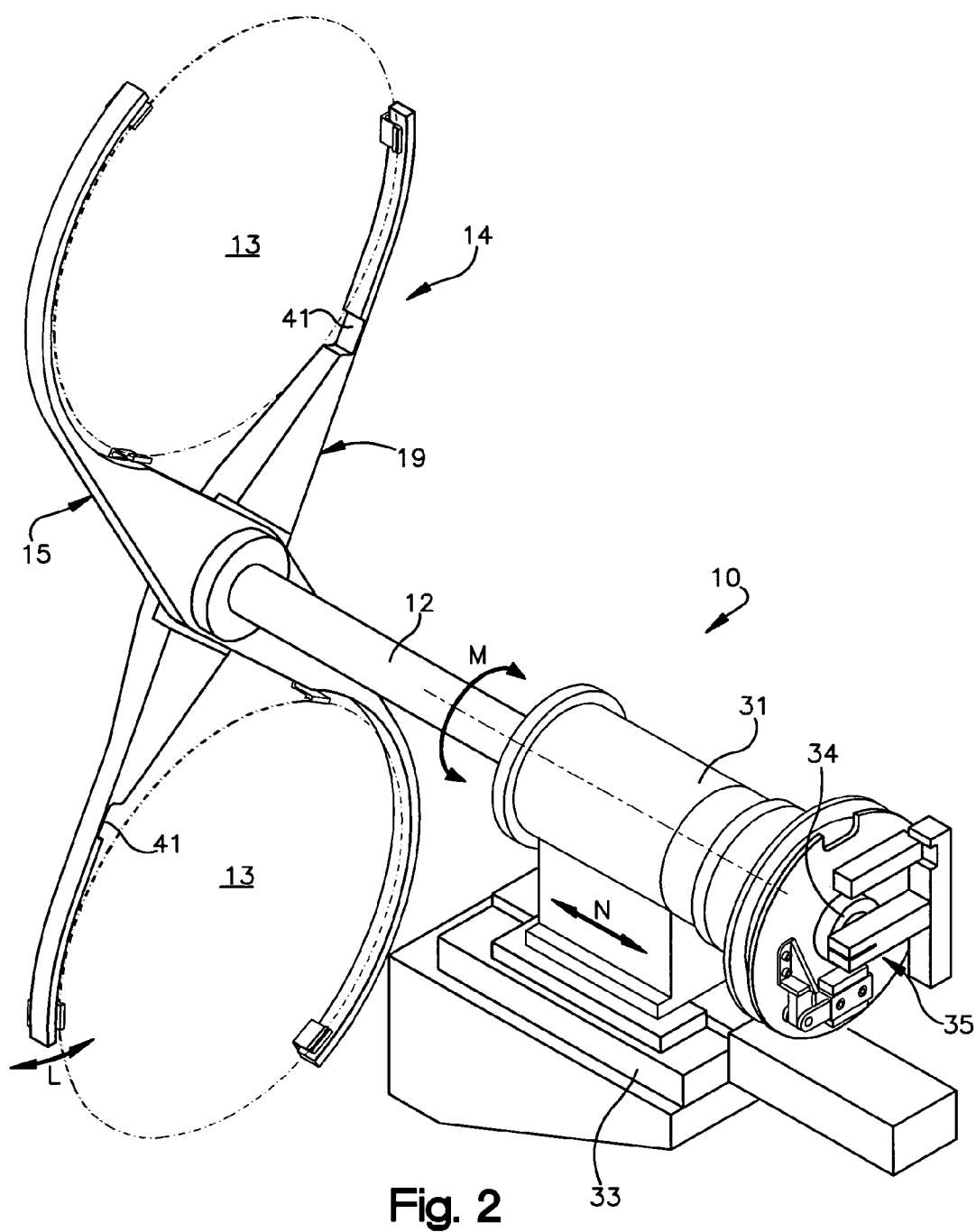
FIG. 2 is a rear perspective view of the workpiece transfer assembly of FIG. 1.

As also shown in FIG. 2, the robot body is connected to a linear actuator 33 that moves the transfer arm assembly 10 along a linear path designated "N" in FIG. 2. A rotation drive unit 31 is coupled to the shaft 12 and includes a first rotation drive unit 35 that rotates the shaft 12 and the entire arm assembly 14 in the orientation shown as "M." A second rotation drive unit 34 drives a secondary shaft that is inside and coaxial with the shaft 12. The secondary shaft also rotates in the M orientation and moves the moving arm relative to the fixed arm in the excursion L that corresponds to a few degrees of rotation.

Figure 3:
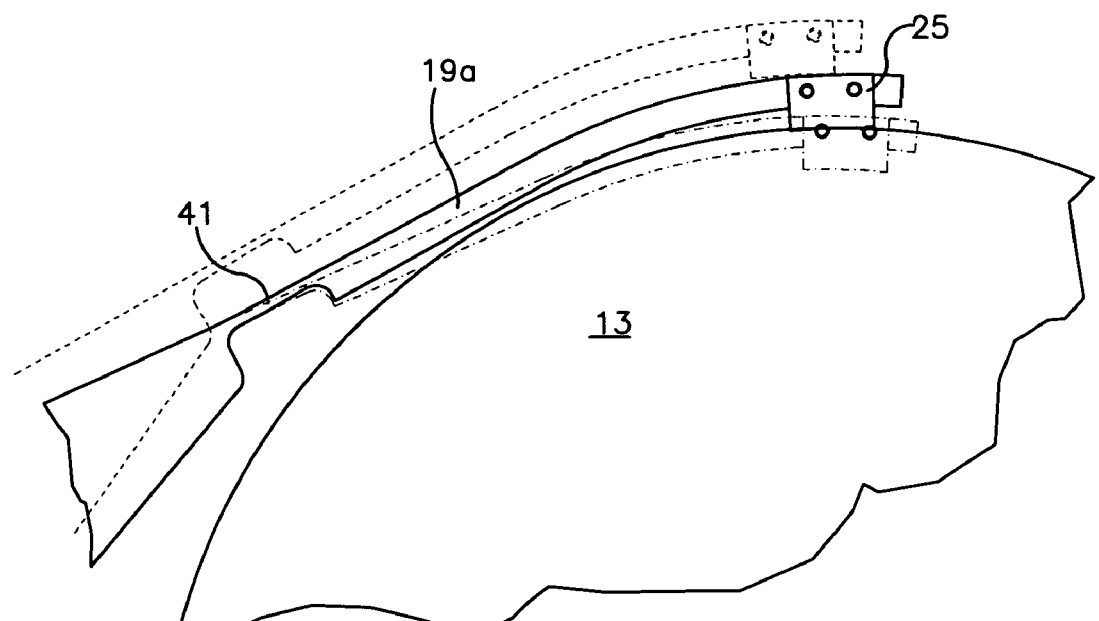
FIG. 3 is a fragmentary view of a workpiece transfer assembly arm constructed in accordance with one embodiment of the present invention.

The transfer arm assembly 14 includes at least one flexure component that provides stress relief when the moving arm 19 is rotated such that a workpiece is supported along portions of its edge by the arms. While the transfer arm assembly shown in FIG. 1 includes several flexure components on each arm, the flexure components could be present only on one of the arms, advantageously the moving arm. The characteristics of the flexure are chosen to provide a given amount of displacement in response to an expected force exerted on the moving arm by the workpiece edge when the moving arm is moved into its workpiece retention position. In this manner, the transfer arm or arms yield to relieve stress on the workpiece edge. An arm flexure 41 shown in FIGS. 1 and 3 and comprises a notch cut into the arm 19 between arm portions 19a and 19b.

Figure 4:
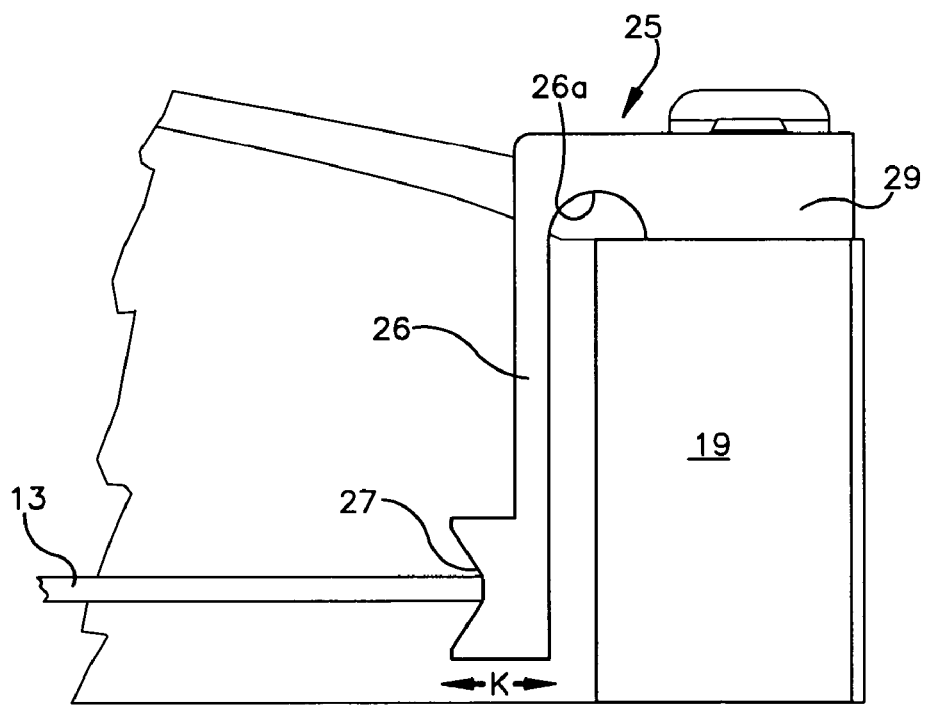
FIG. 4 is a fragmentary view of a workpiece transfer assembly arm constructed in accordance with one embodiment of the present invention.

Multiple workpiece engaging flexures 25 are shown disposed on both the fixed arm 15 and moving arm 19. FIG. 4 shows a cross section of a workpiece engaging flexure. A flexing workpiece support finger 26, that can be advantageously made from Vespel or PEEK material, extends perpendicular to a mounting body portion 29 that is connected the moving arm 19. The workpiece support finger 26 is cantilevered from the body portion 29 and flexes in the direction designated "K" in response to force exerted by the edge of the workpiece 13. The flexibility of the finger 26 in increased by a notch 26a that is present between the body portion 29 and the finger 26. The workpiece edge is supported by a generally V shaped channel 27 in the finger 26. In this manner, when the moving arm is moved to the retention position, the workpiece support finger 26 is able to yield to reduce stress on the edge of the workpiece.

Figure 5A:
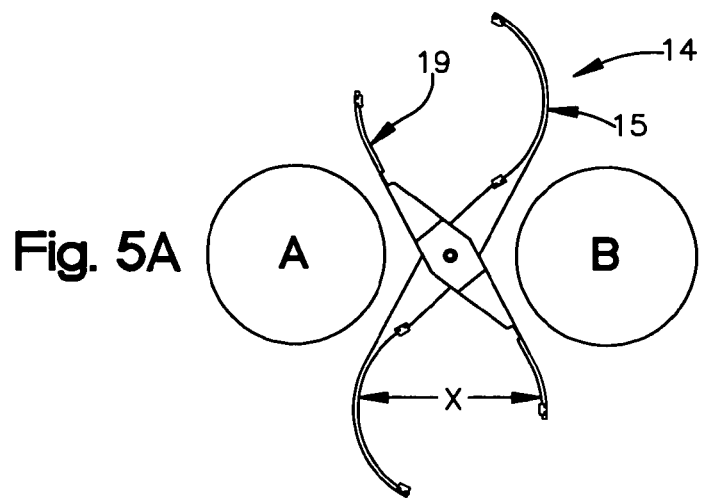
FIG. 5 is a schematic drawing of a sequence of workpiece transfer assembly positions that illustrates operation of the workpiece transfer assembly in accordance with one embodiment of the present invention.
Figure 5B:
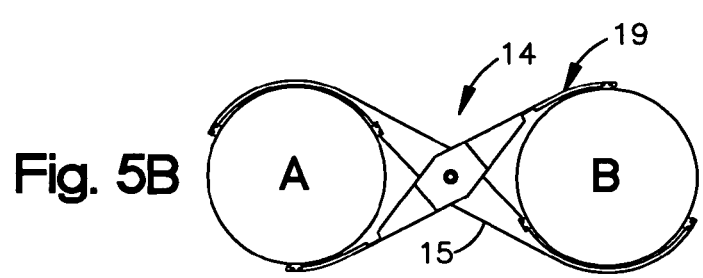
Figure 5C:
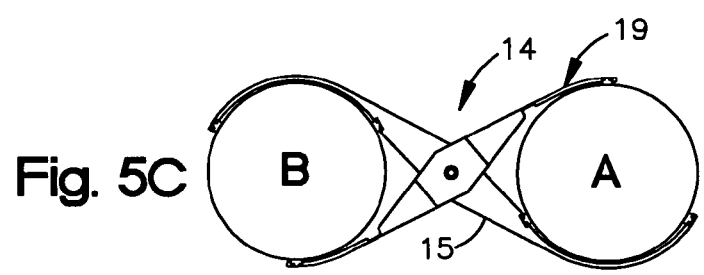
Figure 5D:
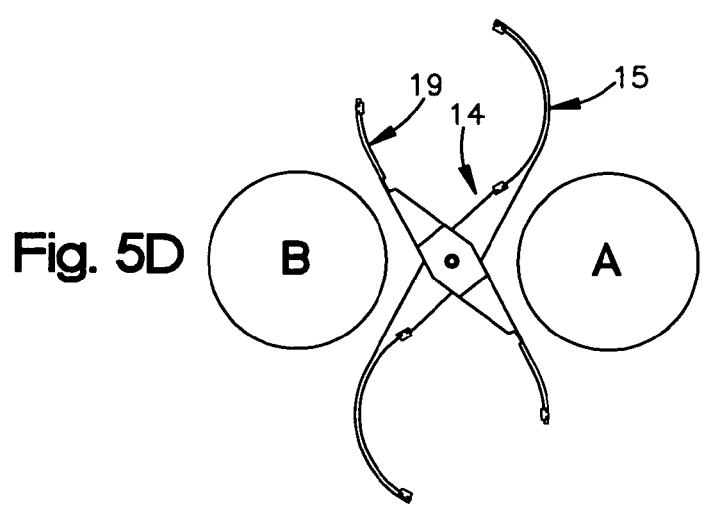

FIGS. 5A-5D illustrate a sequence of positions taken by the transfer arm assembly 14 during normal operation in which the positions of two workpieces A, B are swapped. In FIG. 5A the transfer arm assembly is in a park position. The moving arm 19 is in its release position, spaced apart from the fixed arm 15 by a distance "X" that is slightly larger than the diameter of a workpiece A, B. As shown in FIG. 5B the transfer arm assembly is rotated 90 degrees into proximity with the workpieces and the moving arm 19 is moved toward the fixed arm 15 to its retention position. The flexure assemblies on the moving arm flex to relieve stress on the workpiece edge. Moving from 5B to 5C, the transfer arm assembly 14 is then rotated 180 degrees and the positions of the workpieces is swapped. The moving arm is then moved to its release position and the transfer arm assembly then rotates 90 degrees back to its park position as shown in FIG. 5D. Linear motion (not shown) along N (FIG. 2) is used to remove workpieces from an electrostatic chuck and a loadlock.

While the invention has been described with a degree of particularity, it is the intent that the invention includes all modifications and alterations from the disclosed design falling within the spirit or scope of the appended claims.

I claim:

1. A workpiece transfer assembly comprising:
    a pair of coacting arms including a fixed arm and a moving arm that rotates about a pivot point to engage the outer edge of the workpiece and that include one or more workpiece engaging portions corresponding to an outer contour of a workpiece;
    wherein the one or more workpiece engaging portions have a workpiece engaging surface adapted to engage an edge of the outer contour of the workpiece;
    wherein at least one of the coacting arms includes one or more flexure assemblies that allows deformation of the workpiece engaging surface in a direction away from the workpiece edge in response to pressure on the outer edge of the workpiece from the workpiece engaging surface.

2. The workpiece transfer assembly of claim 1 wherein each of the coacting arms includes an arcuate portion at each of two distal ends and wherein each coacting arm is connected to the pivot point.

3. The workpiece transfer assembly of claim 1 wherein the moving arm includes a flexure assembly that forms a part of the moving arm outside of the workpiece engaging surface.

4. The workpiece transfer assembly of claim 3 wherein the flexure assembly comprises a notch cut into the moving arm between a pivot portion of the moving arm and a workpiece engaging portion of the moving arm.

5. The workpiece transfer assembly of claim 1 wherein the flexure assembly comprises a flexible finger that forms the workpiece engaging surface.

6. The workpiece assembly of claim 1 including a large scale rotation actuator that rotates the pair of coacting arms about the pivot point.

7. The workpiece assembly of claim 1 including a small scale rotation actuator that rotates the moving arm about the pivot point relative to the fixed arm to grip and release the workpiece.

* * * * *